(12) United States Patent
Schwalke

(10) Patent No.: US 6,380,015 B1
(45) Date of Patent: *Apr. 30, 2002

(54) MOSFETS WITH IMPROVED SHORT CHANNEL EFFECTS AND METHOD OF MAKING THE SAME

(75) Inventor: Udo Schwalke, Heldenstein (DE)

(73) Assignee: Siemens Aktiengesellschaft, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/306,617

(22) Filed: May 6, 1999

Related U.S. Application Data

(62) Division of application No. 08/856,336, filed on May 14, 1997, now Pat. No. 5,932,919, which is a continuation of application No. 08/163,108, filed on Dec. 7, 1993, now abandoned.

(51) Int. Cl.[7] ........................................... H01L 21/8238
(52) U.S. Cl. ........................ 438/199; 438/154; 438/232; 438/289; 438/532
(58) Field of Search ................................. 438/153, 532, 438/199, 154, 217, 232, 289, 546, 231

(56) References Cited

U.S. PATENT DOCUMENTS 4,555,842 A * 12/1985 Levinstein et al. ........... 29/571
4,808,555 A * 2/1989 Mauntel et al. ............. 437/191

* cited by examiner

Primary Examiner—Roy Potter

(57) ABSTRACT

In the manufacture of CMOS devices, the n+ gate is partially counterdoped with boron to produce a modified p-type FET that has improved short channel effects, reduced gate induced drain leakage and gate oxide fields for improved reliability. A doped polysilicon layer is formed over a silicon or silicon oxide substrate, and is counterdoped with boron to a level of about $1 \times 10^{13}/cm^2$ to $5 \times 10^{16}/cm^2$ to adjust the work function but without changing the essentially n-type character of the gate electrode. This single counterdoping step achieves improved results for sub-micron devices below 0.5 micron at low cost. For CMOS device manufacturing, the alternating n-type and p-type devices are made in similar manner but reversing the n-type and p-type dopants.

3 Claims, 6 Drawing Sheets

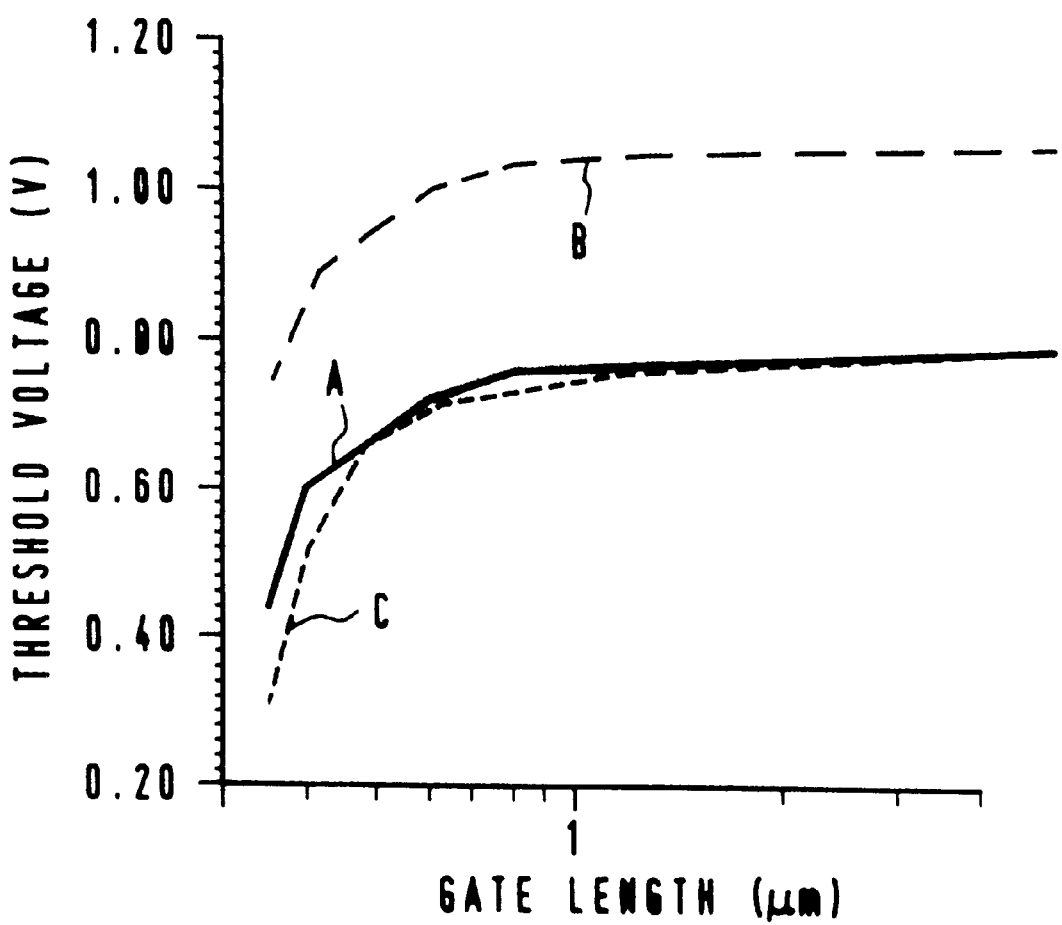

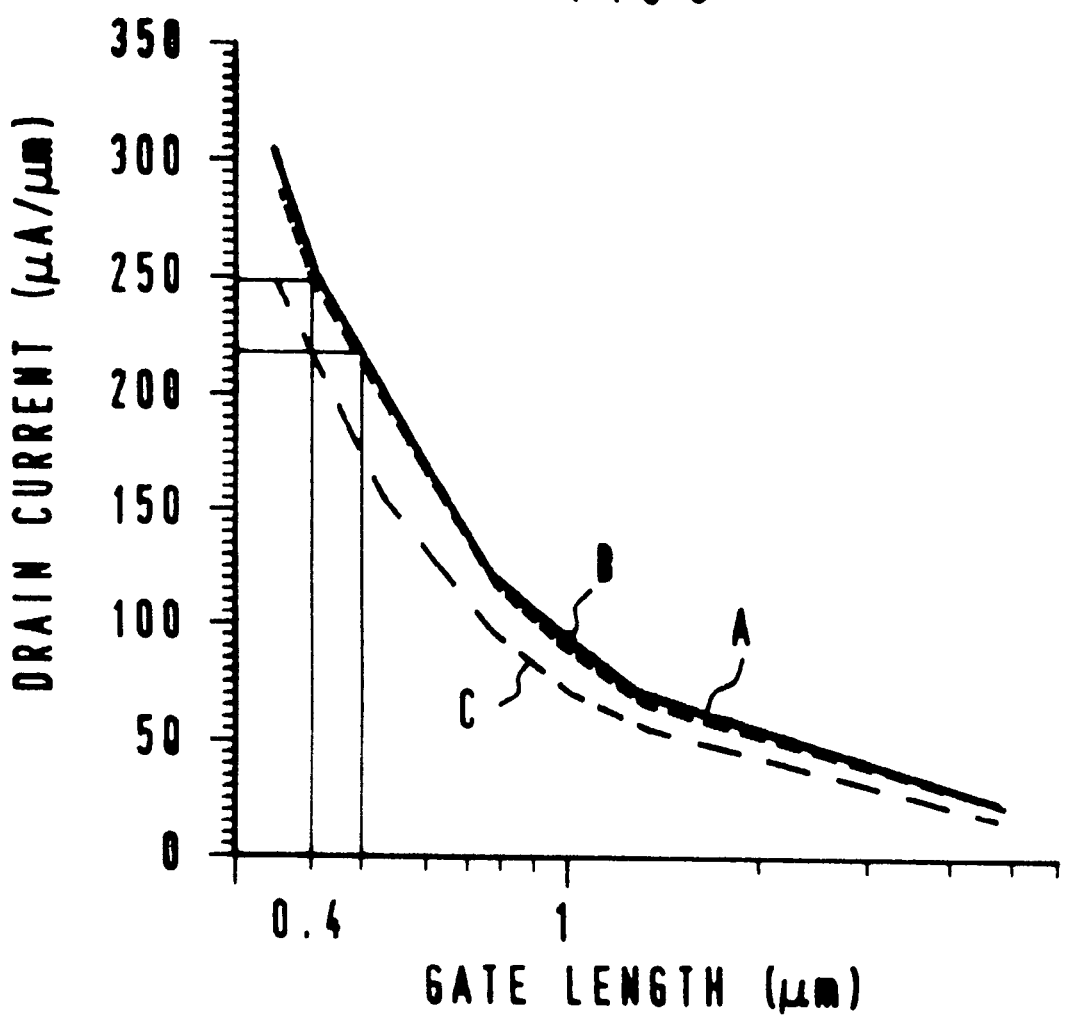

MOSFETS WITH IMPROVED SHORT CHANNEL EFFECTS AND METHOD OF MAKING THE SAME

This is a divisional, of application Ser. No. 08/856,336 filed May 14, 1997, U.S. Pat. No. 5,932,919 which is a continuation of appication Ser. No. 08/163,108 filed Dec. 7, 1993, now abandoned.

This invention relates to improved complementary metal oxide semiconductor (MOS) field effect transistors (FET). More particularly, this invention relates to improved low power, low threshold voltage MOSFETs and a method of making them.

BACKGROUND OF THE INVENTION

Alternating p-type and n-type MOSFETs are used to make complementary metal oxide semiconductor (CMOS) devices for memory and logic applications such as DRAMS and microprocessors. P-type MOS devices require boron channel implants which transform the PFET to a buried channel device. Such devices are more prone to short channel effects, such as a lowering of the threshold voltage, than surface channel devices, as is known. As semiconductor devices become smaller, and as the industry moves to very large scale integrated circuits (VLSI), which use 1 micron design rules, and even ultra large scale integrated circuits (ULSI) that use 0.5 micron design rules, these short channel effects become more marked because the channel implant dosage must be increased. Further, n+ gate p-type FETs have gate-induced drain leakage problems due to larger workfunction differences, which will increase as channel lengths become shorter and gate oxide thickness is reduced. At some point this limits the use of p-type buried channel FETs for CMOS processing.

Various investigators have tried to reduce these problems. Very shallow channel ion implants and shallow source/drain junctions have been tried to improve the short channel characteristics, but the increased technical difficulties of performing these shallow ion implants and the low post-ion implant processing temperatures imposed on such devices have added to the costs of making them. In any case as a practical matter this approach cannot be used for gate lengths below about 0.5 micron.

Thus, other workers have addressed the problem of trying to increase threshold voltage. Lowering the compensating channel implant dose is one way to increase the threshold voltage, but this approach is limited to a maximum threshold voltage of 1 volt for a supply voltage $V_{DD}$=5V, and it cannot be used at all for 0.5 micron CMOS technologies that will use reduced voltages $V_{DD}$=3V. Further, none of the above proposals reduce gate induced drain leakage or reduce the gate oxide fields, which are related to the gate work function difference.

The use of a surface channel p-type FET has also been proposed to overcome the limitations of buried channel p-type FETs, using a boron-doped p-type gate instead of an n-type gate. CMOS requires of course making both $p^+$ gates and $n^+$ gates. However, a very high boron concentration, about $1 \times 10^{20}/cm^3$, is required to achieve doped $p^+$ gates, which can lead to boron penetration into the gate oxide. This in turn leads to oxide degeneration, gate depletion effects and to threshold voltage shifts caused by lateral dopant diffusion within the $n^+$ or $p_+$ gate stacks unless very low temperatures are maintained during processing. Further, exposure of highly doped $p^+$ gates to even small amounts of hydrogen or fluorine cannot be tolerated, but the presence of these elements is difficult to eliminate or control because they are present in silicon oxide and silicon nitride layers.

Thus the search for a method of improving the short channel characteristics of sub-micron buried channel PFETs has continued.

SUMMARY OF THE INVENTION

According to the present invention, improved short channel effects are obtained in buried channel FETs by modifying the gate workfunction difference. In accordance with the invention, the $n^+$ gate for a p-type MOSFET is partially counter-doped with boron to produce a modified p-type FET. The p-type FET of the invention has improved short channel effects, reduced threshold voltage, reduced gate induced drain leakage and reduced gate oxide fields which improve the reliability of these devices. In effect, the gate workfunction difference is adjusted with the boron, but without changing the essentially n-type characteristics of the gate.

In accordance with the method of the invention, counter-doped polycide gate layers are made by depositing a pre-doped $n^+$ polysilicon layer over a silicon or silicon oxide substrate, depositing a thin sacrificial layer of silicon oxide or silicon nitride thereover, ion implanting boron to change the workfunction of the gate, and removing the sacrificial layer prior to completing formation of the gate.

BRIEF DESCRIPTION OF THE DRAWING

FIG. 2 is a graph of threshold voltage versus gate length comparing prior art devices and a device of the present invention.

FIG. 5 is a graph of drain current versus gate length which illustrates the gain in short channel behavior of the devices of the invention.

DETAILED DESCRIPTION OF THE INVENTION

Figure 1A:
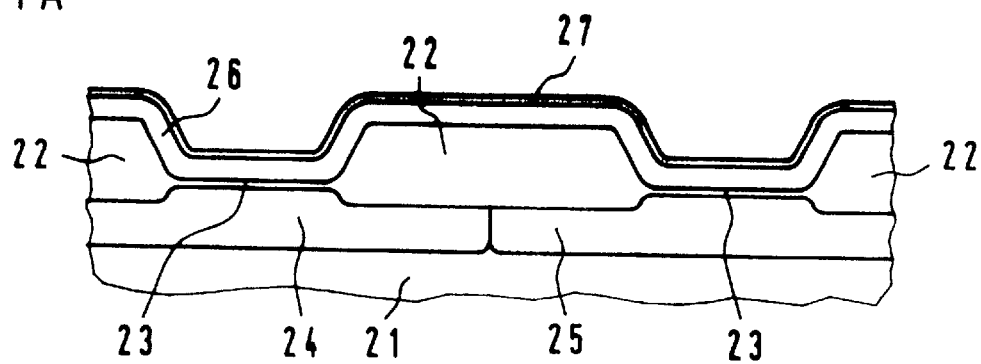
FIGS. 1A–1H are cross sectional views of a semiconductor substrate illustrating the process steps for preparing a CMOS device of the present invention.

An illustration of the manufacture of the counterdoped CMOS devices of the present invention in a CMOS process will be given with reference to FIG. 1.

A p-well 24 and an n-well 25 are implanted in a crystalline silicon wafer 21 in known manner. A field oxide (LOCOS) layer 22 is grown thereover and patterned to expose a portion of the p-well and n-well regions 24, 25 respectively.

A thin gate oxide layer 23 is deposited in known manner in the exposed regions and a polysilicon layer 26 is deposited thereover. The polysilicon layer 26 is doped with arsenic or phosphorus to a level in the range of about $1 \times 10^{20} cm^{-3}$ to $1 \times 10^{21} cm^{-3}$. The polysilicon layer 26 can be pre-doped by co-depositing with the required ions, or the polysilicon layer 26 can be ion implanted after deposition to the preselected dopant level.

A thin sacrificial silicon oxide or silicon nitride layer 27 is then deposited over the polysilicon layer 26 to reduce channeling effects during the next step. This sacrificial layer also serves as a barrier layer to prevent contamination of the polysilicon layer 26 and to prevent loss of ions by diffusion from the polysilicon layer 26 during subsequent annealing, as for example, to activate the dopant ions in the polysilicon layer 26. The resulting structure is as shown in FIG. 1A.

Figure 1B:
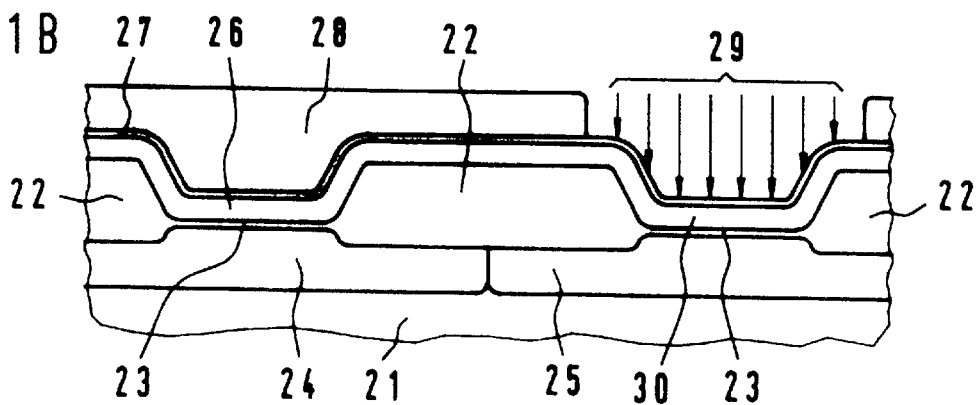

A photoresist layer 28 is deposited and patterned to open the polysilicon layer 26 over the n-well 25. Boron is ion implanted (29) into the polysilicon layer 26, suitably to a level in the range of about $1 \times 10^{13}/cm^2$ to $5 \times 10^{16}/cm^2$, thus counterdoping the exposed polysilicon layer 30, while retaining its primary n-type characteristics. The level of the boron counterdoping used will depend on the amount of $n^+$ type dopant, i.e., arsenic, or phosphorus, present in the polysilicon layer 26, the polysilicon grain structure and the like. Since boron does not segregate at the grain boundaries of polysilicon as do n-type dopants, the counterdoping effect will be very efficient. This structure is shown in FIG. 1B.

Figure 1C:
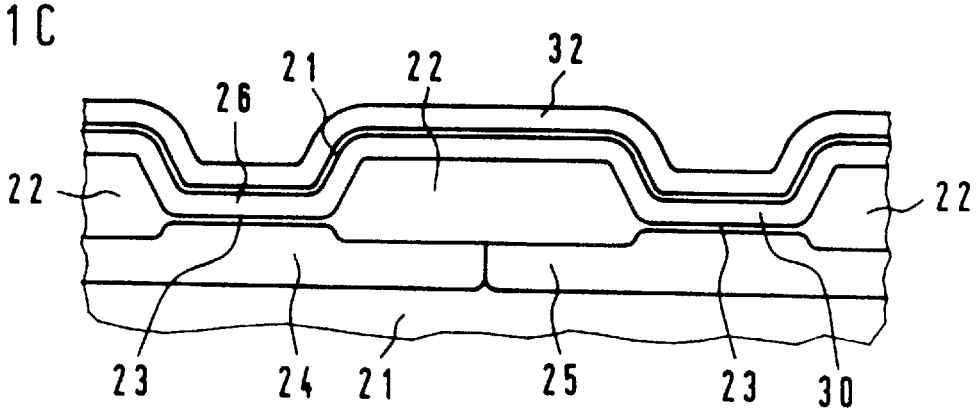

The photoresist layer 28 and the sacrificial silicon oxide/silicon nitride layer 27 are etched away and a silicide layer 31 is deposited over the polysilicon layer 26. This silicide layer 31 enhances the conductivity of the gate. Suitably a metal layer such as Ti, Co, Mo, Ta, W or Pt is deposited and heated to form the corresponding silicide. Alternatively, a metal silicide may be directly deposited onto the polysilicon layers 26 and 30. A layer 32 of silicon oxide or silicon nitride is deposited over the silicide layer 31 to protect the gate from subsequent ion implantation employed to form the source and drain regions. The resulting structure is shown in FIG. 1C.

Figure 1D:
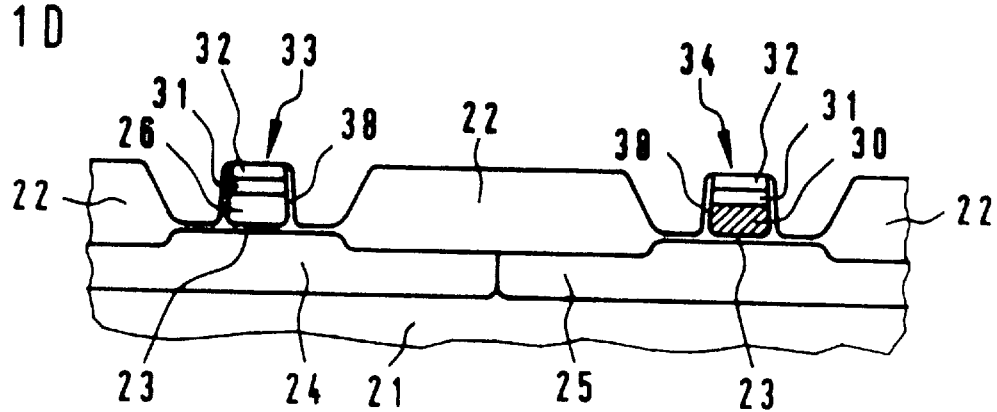

The gates are formed by conventional photolithography techniques to form a (n+/p) counterdoped gate stack 34 to control the p-type FET. A corresponding $n^+$ polycide gate stack 33 is made in similar manner but with oppositely doped implants and omitting the gate counterdoping step. This provides the gate electrode 33 for the complementary n-type FET. The gate stacks 33 and 34 are encapsulated in silicon oxide 35 and patterned in known manner. The resultant structure is shown in FIG. 1D.

Figure 1E:
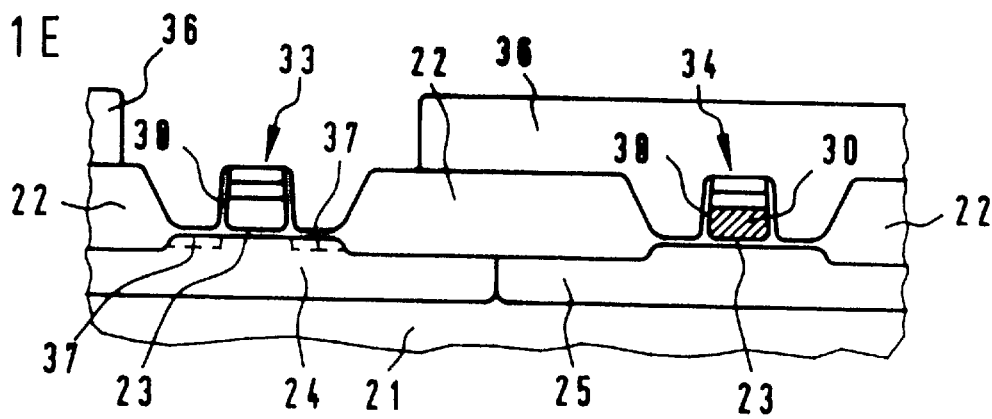

A photoresist layer 36 is deposited and defined to open the p-well areas on either side of the gate 33 and are implanted to form n-parts of n-LDD source and drain junctions 37. The structure is shown in FIG. 1E.

Figure 1F:
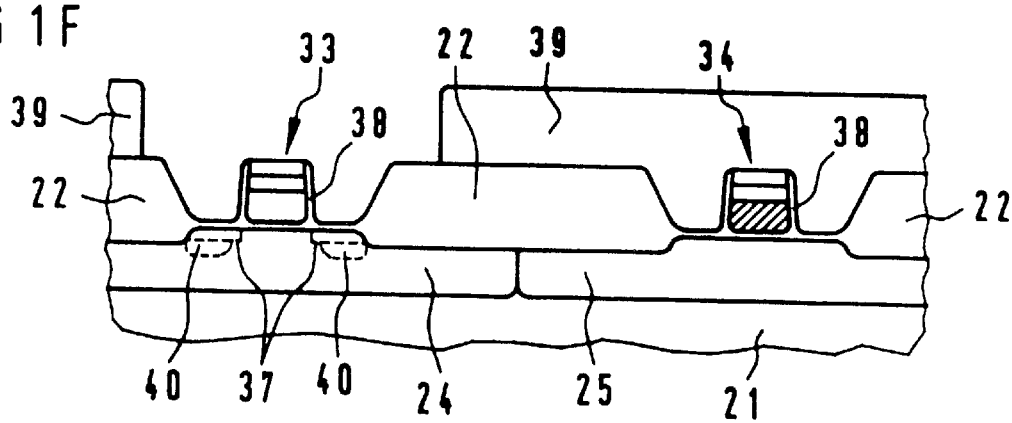

The photoresist layer 36 is removed and the gate sidewall spacers 38 are made in conventional manner. A photoresist mask layer 39 is deposited and defined to open the n-type FET area and a high dose $n^+$ ion implant is performed to complete the n-type-LDD junction 40, as shown in FIG. 1F.

Figure 1G:
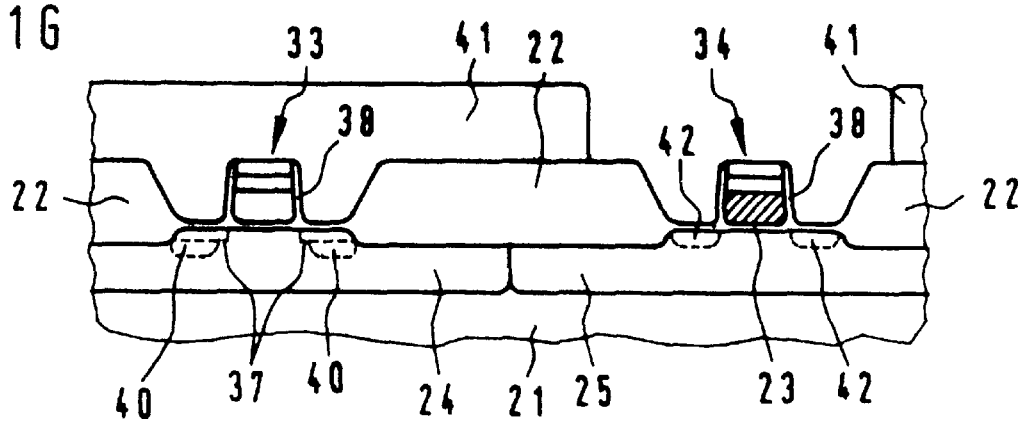
Figure 1H:
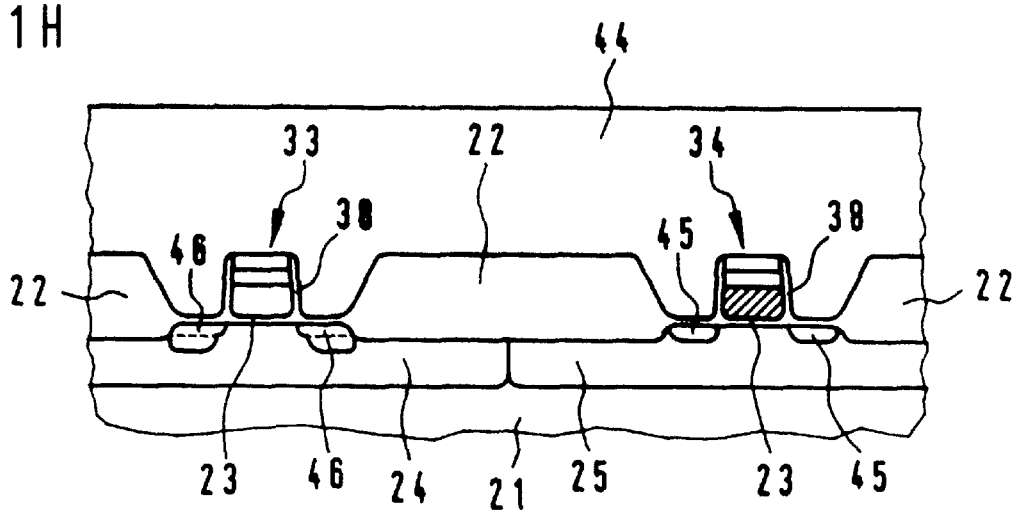

The photoresist layer 39 is removed and another photoresist layer 41 is deposited and defined to expose the p-type FET area as shown in FIG. 1G. Ion implantation of the $p^+$ source and drain region is carried out to form p+ source/drain junctions 42. After removal of the photoresist layer 41, a passivation layer 44, for example, a borophosphosilicate glass layer, is deposited and reflowed to planarize the surface. This reflow step is performed at temperatures below 950° C. In addition to planarizing the surface, this step also serves to activate the implanted n-type FET junctions 40, driving the dopants into the substrate and forming the p-type FET junction 45 and the n-type FET junction 46 as shown in FIG. 1H.

In accordance with the invention, partially counterdoping the $n^+$ gate reduces the gate workfunction difference, which lowers the threshold voltage of the p-type FET. Thus by adjusting the amount of boron dopant used, the gate workfunction can be varied for optimization of a particular device. The threshold voltage can be lowered without degrading the short channel characteristics, or the threshold voltage can be kept constant while reducing the compensating channel implant to improve the short channel characteristics.

The devices are completed in conventional manner to etch the contact areas and deposit metal contacts therein.

FIG. 2 is a graph comparing threshold voltage versus gate length, in microns, of a device of the invention and a prior art device that illustrates the improvement in threshold voltage performance of the counterdoped gate device obtained by the present invention. Curve A is a graph of a conventional p-type FET which has a threshold voltage of about 0.8 V and a roll off of about 470 mV. If the channel doping is reduced, the roll off can be improved to about 320 mV, see curve B, but the threshold voltage is increased to almost 1.10 V, which is unacceptable. The threshold voltage of a device of the present invention, see curve C, is adjusted to the desired 0.8 V value, and has a roll off of 340 mV, which is an improvement of almost 30%.

Figure 3:
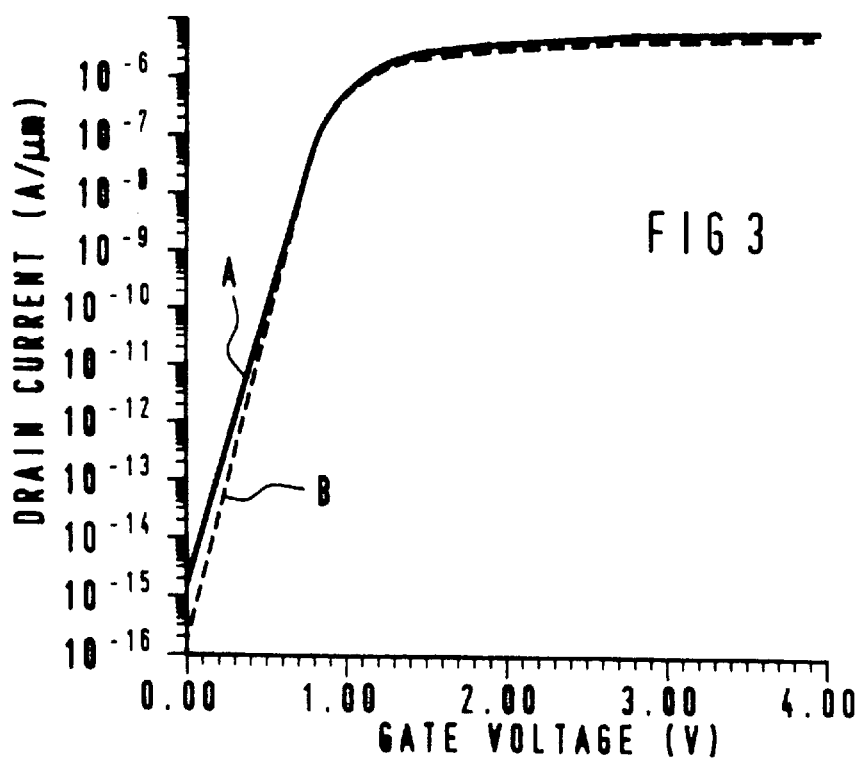
FIG. 3 is a graph of drain current versus gate voltage comparing a prior art device and a device of the invention.

FIG. 3 illustrates the subthreshold characteristics of the present devices. As shown in FIG. 3, the sub threshold voltage slope (S) improves from 96 mV/dec (curve A) to 88 mV/dec (curve B) for the present devices. Both the improved subthreshold characteristics as well as the lower Vth roll off improves the off leakage, which is important for low power applications. For example at a gate length of 0.4 micron, the device leakage is reduced by about an order of magnitude.

Figure 4:
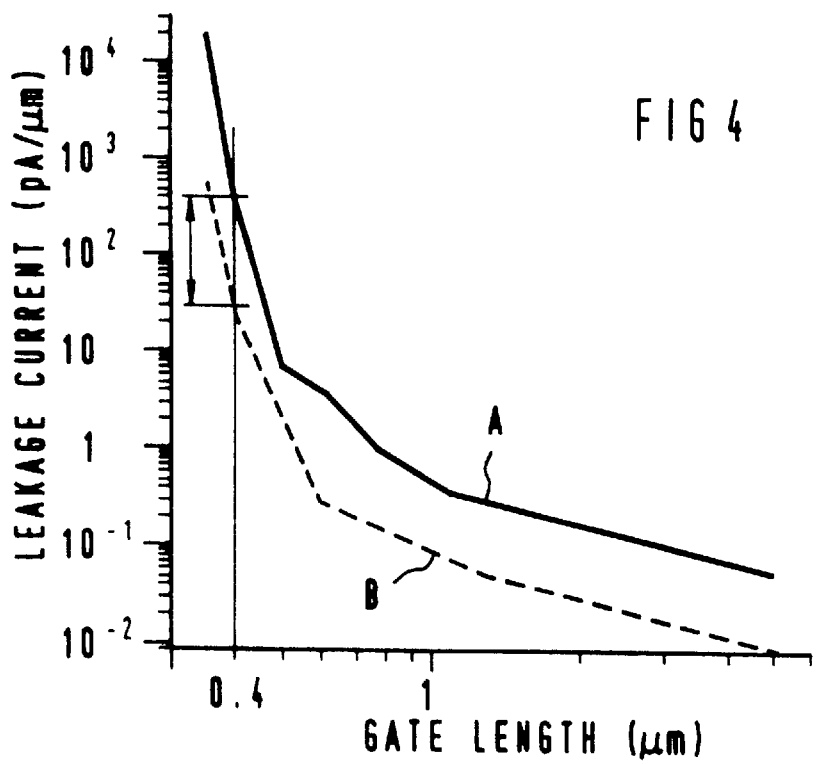
FIG. 4 is a graph of leakage current versus gate length which illustrates improved subthreshold characteristics of devices of the invention.

FIG. 4 is a graph of leakage current versus gate length that illustrates that for a 0.4 micron gate length device, the leakage current is reduced by about one order of magnitude between a conventional $n^+$-type MOS gate electrode, which has a workfunction of +0.550 eV, marked as curve A, and a device including the counterdoped gate electrode of the present invention, which has a workfunction of −0.275 eV, marked as curve B.

FIG. 5 illustrates that the present devices (curve B) has a slight reduction in drive current, due to the mobility reduction caused by the lower workfunction; however, this loss is more than compensated for by the gain in short channel behavior, which allows a channel length reduction. When normalized to equal off leakage, the present device gains in saturation current by more than 10% for a gate length of 0.4 micron.

In the manufacture of buried channel n-type FET .devices, the same processing steps can be used as detailed above except reversing the n- and p-type dopants of the above-described p-type FET.

The lowered workfunction difference detailed above reduces the gate-induced drain leakage and off-state oxide fields, thereby improving device reliability. Further, the present process requires only a single added ion implant step using a non-critical mask, thereby adding little to the time and cost of producing the present devices.

Various changes in the above described method can be made as will be apparent to one skilled in the art. The boron counterdopant can be activated by heating after depositing the silicide layer, or a later heating or annealing step can be performed to activate the boron dopant. Other variations in the processing steps can be made as will be apparent to those skilled in the art and are meant to be included herein. The invention is only meant to be limited by the appended claims.

I claim:

1. In a process of making a submicron p-type complementary metal oxide semiconductor in a buried channel field effect transistor comprising:

depositing a predoped $n^+$ type polysilicon layer on a substrate, the improvement of adjusting the gate workfunction difference with boron without changing the n-type characteristics of the gate comprising: depositing a sacrificial layer of silicon oxide or silicon nitride over the polysilicon layer;

counterdoping the n+ gate by ion implanting boron to a level of about $1\times10^{13}$cm$^2$ to about $5\times10^{16}$cm$^2$ in the polysilicon layer; and removing the sacrificial layer of silicon oxide or silicon nitride prior to completion of the gate.

2. A process according to claim 1 wherein the polysilicon is doped with arsenic or phosphorus to a level of about $1\times10^{20}$cm$^3$ to about $1\times10^{21}$cm$^3$.

3. In a process of making an n-type metal oxide semiconductor field effect transistor comprising depositing a pre-doped p$^+$ type polysilicon layer on a substrate, the improvement which comprises depositing a sacrificial layer of silicon oxide or silicon nitride over the polysilicon layer;

ion implanting positive dopant ions to a level of about $1\times10^{13}$cm$^2$ to about $5\times10^{16}$cm$^2$ in the polysilicon layer; and removing the sacrificial layer of silicon oxide or silicon nitride.

* * * * *